(12) United States Patent
McAdams

(10) Patent No.: US 7,554,867 B2
(45) Date of Patent: Jun. 30, 2009

(54) CAPACITOR BOOST SENSING

(75) Inventor: Hugh P. McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 666 days.

(21) Appl. No.: 11/341,083

(22) Filed: Jan. 27, 2006

(65) Prior Publication Data
US 2007/0177422 A1 Aug. 2, 2007

(51) Int. Cl.
*G11C 7/02* (2006.01)
(52) U.S. Cl. .................. 365/207; 365/206; 365/208; 365/214; 327/50; 327/51; 330/250; 330/252
(58) Field of Classification Search ............. 365/206, 365/207, 208, 214; 327/50–51; 330/250, 330/252
See application file for complete search history.

(56) References Cited

U.S. PATENT DOCUMENTS

| | | |
|---|---|---|
| 4,858,193 A | 8/1989 | Furutani et al. |
| 5,031,143 A | 7/1991 | Jaffe |
| 5,844,265 A * | 12/1998 | Mead et al. ............... 257/291 |

OTHER PUBLICATIONS

Rainer, Kraus, et al., "A Sense-Signal Doubling Circuit for DRAMs," *IEEE International Solid-State Circuits Conference*, Feb. 25, 1987, 3 pages.

* cited by examiner

*Primary Examiner*—VanThu Nguyen
(74) *Attorney, Agent, or Firm*—Wade J. Brady, III; Frederick J. Telecky, Jr.

(57) ABSTRACT

A memory cell for storing a charge that gives rise to a cell voltage representing a bit value, the memory cell being capable of having the cell voltage boosted to a boost value at a time following reading of the stored charge. The memory cell includes a first capacitor connected between a first node and ground. A second capacitor is connected between a second node and ground, and a first switch is connected between the first node and the second node. A second switch and a third capacitor are connected in series between the first node and the second node, with a terminal of the second switch being connected to the first node, the common connection node of the second switch and the third capacitor comprising a third node. A third switch is connected between the third node and ground. In operation, in a first storage phase the first and third switches are closed and the second switch is open. In a second storage phase the first and third switches are open and the second switch is closed, resulting in the cell voltage being boosted to the boost value.

12 Claims, 6 Drawing Sheets

CAPACITOR BOOST SENSING

TECHNICAL FIELD OF THE INVENTION

The present invention relates to electronic memories that store bit values as charge on capacitors, and more particularly relates to improved methods and apparatus for sensing the voltage arising from charge. Background of the Invention In the 1987 IEEE International Solid-State Conference, K. Rainer, K. Hoffmann and H. Johann presented a simple circuit technique in the paper, "A Sense-Signal Doubling Circuit for DRAM," for enhancing the signal level presented to the sense amplifier in a DRAM. Their preamplifier circuit, shown in FIG. 2 of their paper, is reproduced in FIG. 5 herein. The gain of this preamplifier, shown in FIG. 5 of their paper, is reproduced in FIG. 6 herein.

Although not shown in their paper, the mathematical expression for the gain of the preamplifier can be derived from the basic physical properties of charge conservation and capacitive voltage division. This expression has been evaluated for additional bitline and DRAM cell capacitor values, Cbl and Cc, respectively, that might typically be found in commercial DRAMs that have been produced since the publication of this paper. FIG. 7 herein plots this gain expression for the values of Cbl and Cc shown in the legend.

It can be seen from FIG. 7 that as the bitline capacitance is decreased, the gain, or signal amplification, produced by this circuit begins to degrade. Qualitatively, as the sense amplifier input capacitance and coupling capacitor, Cp, values become significant percentages of the bitline capacitance, charge that is pulled from the bitline capacitance and shared with the coupling—sense amplifier input series capacitance results in greater voltage sharing with the bitline parasitic capacitance. This voltage sharing results in a loss of gain at the sense amplifier input. Thus, as technology scaling progresses, resulting in smaller bitline capacitances, this preamplifier implementation becomes less effective and, therefore, less attractive to a memory designer.

It would therefore be desirable to have a preamplifier that overcomes the prior art gain loss disadvantage that occurs with ever smaller technology scaling.

SUMMARY OF THE INVENTION

The present invention is a preamplifier providing a boosted voltage for a variety of circuit applications. When applied to memory arrays, it produces a significant signal improvement in such memories, while requiring only a modest increase in circuit complexity, compared to a conventionally designed memory. Depending on specific implementation, only two additional control signals are required for operation. Its impact on sensing time is negligible.

To accomplish this, the present invention provides a preamplifier having a first node and a second node. A first switch is connected between the first node and the second node. A second switch and a first capacitor are connected in series between the first node and the second node, with a terminal of the second switch being connected to the first node, the common connection node of the second switch and the first capacitor comprising a third node. A third switch is connected between the third node and ground. The first and third switches are adapted to be closed and the second switch to be open, in a first operation phase, and the first and third switches being adapted to be open and the second switch to be closed, in a second operation phase during which the voltage on the second node is boosted to an amplified value.

In an embodiment producing a boosted voltage for memory cell sensing, a memory cell is provided for storing a charge that gives rise to a cell voltage representing a bit value, the memory cell being capable of having the cell voltage boosted to a boost value at a time following storage of the charge. The memory cell includes a first capacitor connected between a first node and ground. A second capacitor is connected between a second node and ground, and a first switch is connected between the first node and the second node. A second switch and a third capacitor are connected in series between the first node and the second node, with a terminal of the second switch being connected to the first node, the common connection node of the second switch and the third capacitor comprising a third node. A third switch is connected between the third node and ground. In operation, in a first storage phase the first and third switches are closed and the second switch is open. In a second storage phase the first and third switches are open and the second switch is closed, resulting in the cell voltage being boosted to the boost value.

These and other aspects and features of the invention will be apparent to those skilled in the art from the following detailed description of the invention, taken together with the accompanying drawings.

DETAILED DESCRIPTION OF THE PREFERRED EMBODIMENT

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 7:
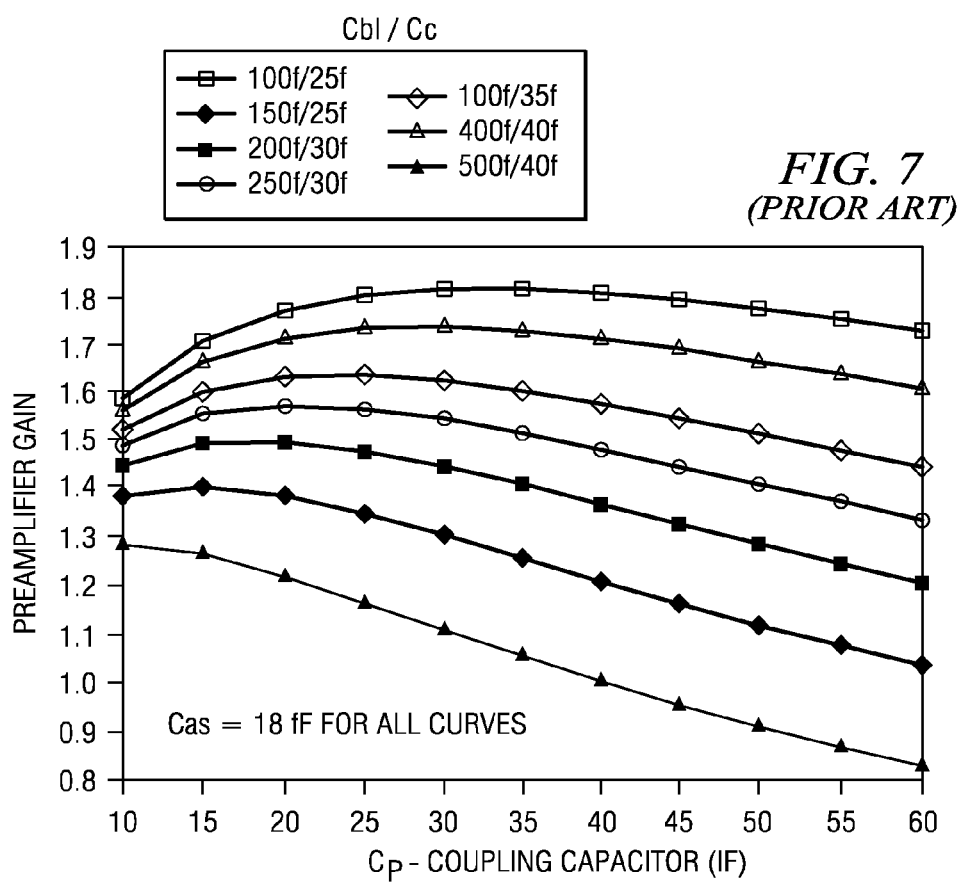
FIG. 7 is a graph showing the relationship of gain to coupling capacitance for the circuit of FIG. 5, for different values of the DRAM memory cell capacitors Cbl and Cc.
Figure 8:
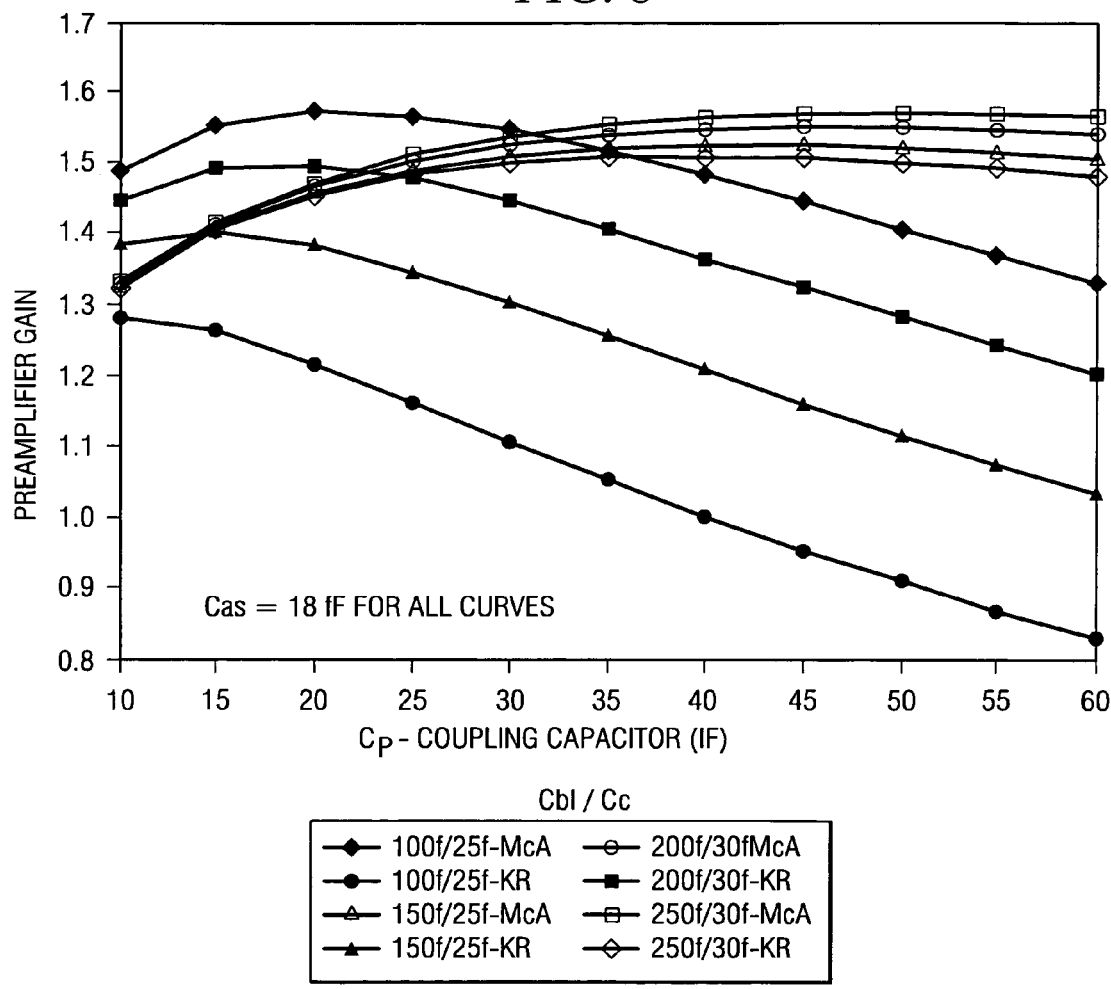
FIG. 8 is a graph showing the relationship of gain to coupling capacitance for the circuit of FIG. 5, as compared with the same for a preferred embodiment of the present invention, for different values of the DRAM memory cell capacitors Cbl and Cc.

Embodiments of the preamplifier configurations disclosed herein overcome the loss of gain as bitline capacitance is reduced in memory cell preamplifiers. A comparable gain expression has been derived for a preferred embodiment of the inventive circuit, and has been plotted in FIG. 8 to illustrate the benefits that may be achieved when the inventive principles disclosed herein are applied. Gain values for the same Cbl and Cc assumptions for the prior art graph of FIG. 7 have been plotted in FIG. 8 as well, for ease of direct comparison. As bitline capacitance is reduced, it can be seen that gain for the inventive configuration changes very little. In addition, as the coupling capacitance, Cp, is increased, the gain improves rather than rapidly degrading, as in the prior art. Since the most area efficient way to implement Cp is the use of the same cell capacitor structure as used in the memory cell, the improvement in gain with larger Cp becomes a distinct advantage. The use of multiple array cell capacitors to form Cp, as cell capacitance is reduced, is effective for increasing the signal voltage, while only slightly increasing chip area.

Figure 1:
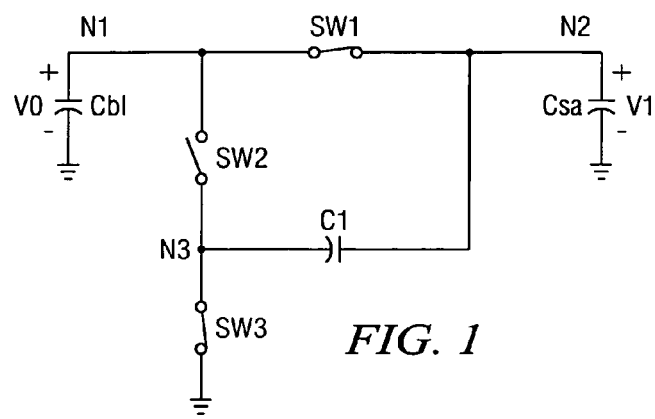
FIG. 1 is a simplified schematic of a preferred embodiment of the present invention.

FIG. 1 is a simplified schematic of a preferred embodiment of the present invention, which facilitates mathematical analysis of the signal improvement produced. As can be seen, a capacitor Cbl, which represents the bitline parasitic capacitance, is connected between a node N1, which is a bitline node, and ground, and a capacitor Csa is connected between a node N2, which is a sense amplifier input node, and ground. Nodes N1 and N2 are connected to one another through a switch SWI, initially closed. A switch SW2, initially open, has one terminal connected to node N1 and another terminal connected to node N3 (hereinafter, "third node"). Node N3 is connected to a terminal of a switch SW3, initially closed, and a plate of a capacitor C1 (hereinafter, "first capacitor"). The other plate of capacitor C1 is connected to node N2. The other terminal of switch SW3 is connected to ground. The voltage across capacitor Cbl is designated V1, while the voltage across capacitor Csa is designated V2.

In operation, assume that an initial voltage $V2i$ has been established on node N2 with the Switches SW1-3 set as shown in FIG. 1. This may be accomplished, for example, by applying a voltage to node N1 in a memory cell read operation. With this setting $$V2i = V1i. \quad \text{Eq. (1)}$$

Now switches SW1 and SW3 are opened and switch SW2 is closed. Charge redistribution occurs on the capacitors. Using the conservation of charge, we can write $$V1i*Cbl = V1f*(Cbl+Cseries) \quad \text{Eq. (2)}$$

where $V1i$ is the initial voltage on node N1 before switching SW1-SW3, $V1f$ is the resultant voltage on N1 after charge redistribution and $Cseries=(C1*Csa)/(C1+Csa)$, is the equivalent series capacitance of capacitors C1 and Csa.

$V1f$, is found by manipulation of Equation (2) to be $$V1f = (V1i*Cbl)/(Cbl+Cseries) \quad \text{Eq. (3)}$$

When switch SW2 is closed a voltage step of magnitude $V1f$ occurs on the left plate of capacitor C1. Through capacitive voltage division between capacitors C1 and Csa a voltage step of magnitude $(V1f*C1)/(C1+Csa)$ occurs on node N2. Therefore, the final voltage on node N2, $V2f$, is $$V2f = (V1f*C1)/(C1+Csa) + V2i \quad \text{Eq. (4)}$$

Substituting Equations (1) and (3) into Equation (4), we obtain $$V2f = V2i*(1 + C1*(Cbl+Cc)/((C1+Csa)*(Cbl+Cc) + C1*Csa)). \quad \text{Eq. (5)}$$

The significance of Equation (5) is that $V2f > V2i$, since the coefficient of $V2i$ is always greater than 1. Thus, by switching capacitor C1 from a parallel connection to a series connection with Csa and isolating node N2 from N1, voltage amplification is achieved on node N1.

A more detailed embodiment will now be described, in which the principles of the present invention are applied to an arrayed memory. First, by way of background, refer to FIG. 2, which represents cells associated with a typical bitline in an arrayed memory. Ferroelectric memory cells are used for illustration here, but it will be understood that the inventive principles apply as well to other cell memories, such as dynamic random access memory (DRAM). Each memory bit location (cell) is composed of an NMOS passgate, or, access transistor $AT_i$, with its gate connected to a wordline, $WL_i$, and a ferroelectric capacitor $FC_i$, with one electrode connected to a plateline, $PL_j$, and the other connected to the source of an access transistor. Six exemplary wordlines are shown, $WL_{0-5}$, as well as six exemplary access transistors $AT_{0-5}$, six exemplary ferroelectric capacitors $FC_{0-5}$ and three platelines $PL_{01}$, $PL_{23}$, and $PL_{45}$. Each bit has the drain of its passgate $AT_i$ connected to a common bitline, $BL_k$.

The bitline $BL_k$ is used to convey the signal from the accessed cell to one input of a sense amplifier SA. The other input of the sense amplifier SA is connected to a reference input, REF. This reference input may consist of another similar bitline, which is typical in the case where the sense amplifier is a cross-coupled latch, or a reference voltage, in the case of a comparator. Each cell has parasitic capacitance that it contributes to the overall capacitance of the bitline $BL_k$ due to source-to-bulk junction capacitance, gate-to-source overlap capacitance, bitline contact-to-gate capacitance, etc. In addition, there is parasitic capacitance from the routing of the bitline connection itself. Since there are typically from 256 to 512 bits connected on a single bitline, this parasitic bitline capacitance can be relatively large, in the 150-300 femtofarad (fF) range.

The input capacitance of the sense amplifier SA, by comparison, is very much smaller than the bitline $BL_k$ capacitance. A typical value for this capacitance is in the 10-30 fF range, depending on the specific circuit configuration and size of transistor devices used.

Figure 2:
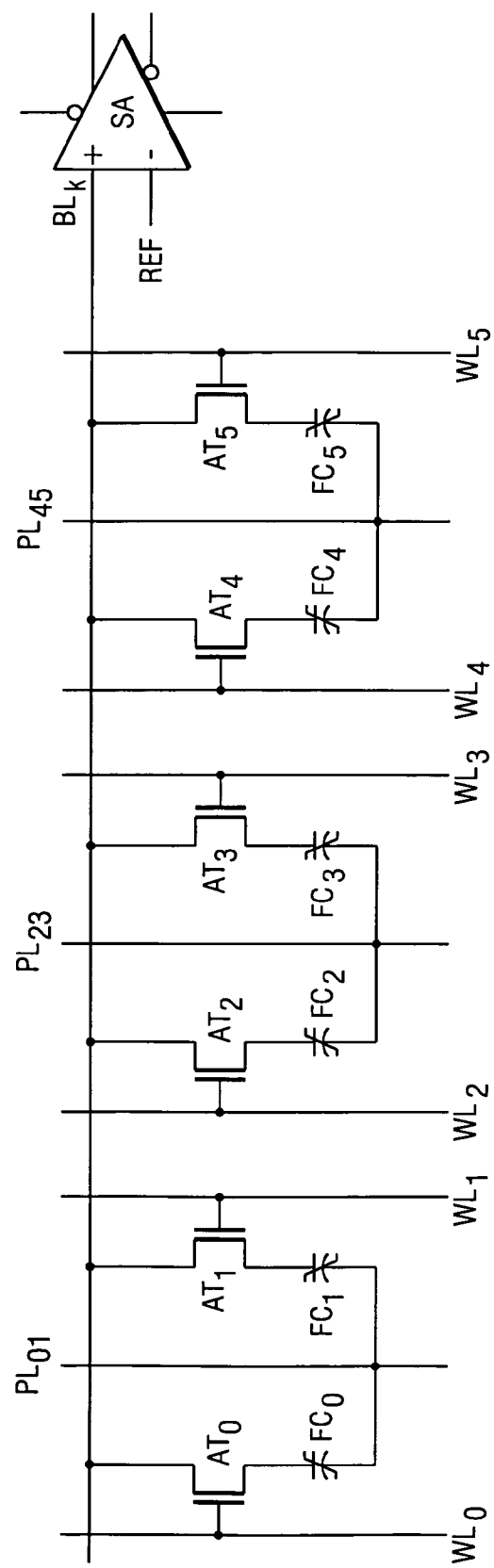
FIG. 2 is a circuit diagram of a portion of a ferromagnetic cell memory array, to which the principles of the present invention may be applied.

Relating the circuit of FIG. 2 to that of FIG. 1, and to the formulas described above, we equate $BL_k$ to N1 in FIG. 1 and the parasitic bitline capacitance to the capacitor Cbl. The sense amplifier SA input capacitance is equated to the capacitor Csa in FIG. 1. The initial signal level developed from the cell onto the bitline $BL_k$ is $V1i$. However, to achieve the benefits demonstrated in Equation (5), the circuit of FIG. 2 must be modified in accordance with the principles of the present invention.

Figure 3:
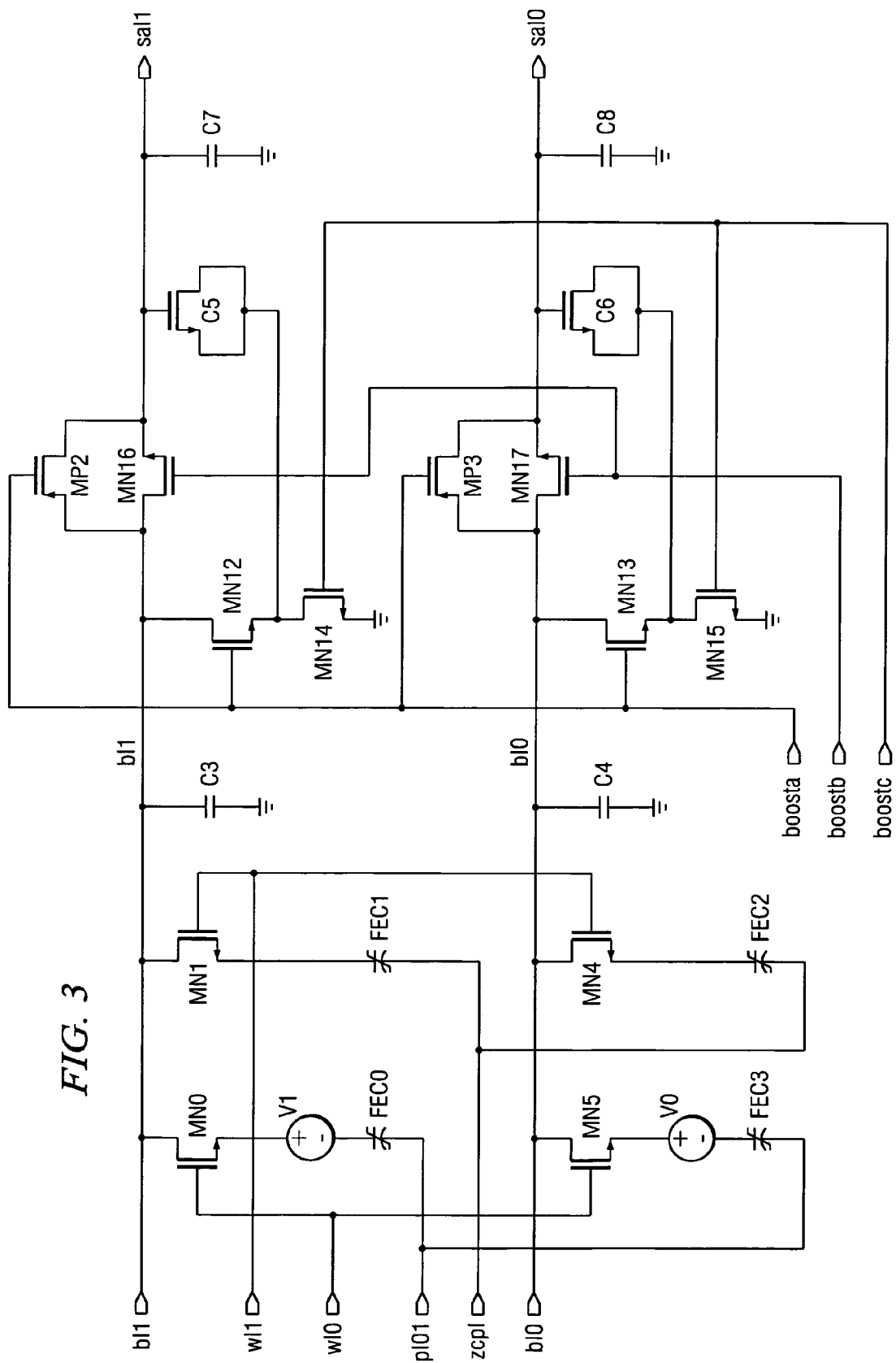
FIG. 3 is a circuit diagram of a second embodiment of the present invention, representing a portion of a ferromagnetic cell memory array modified in accordance with the principles of the present invention.
Figure 5:
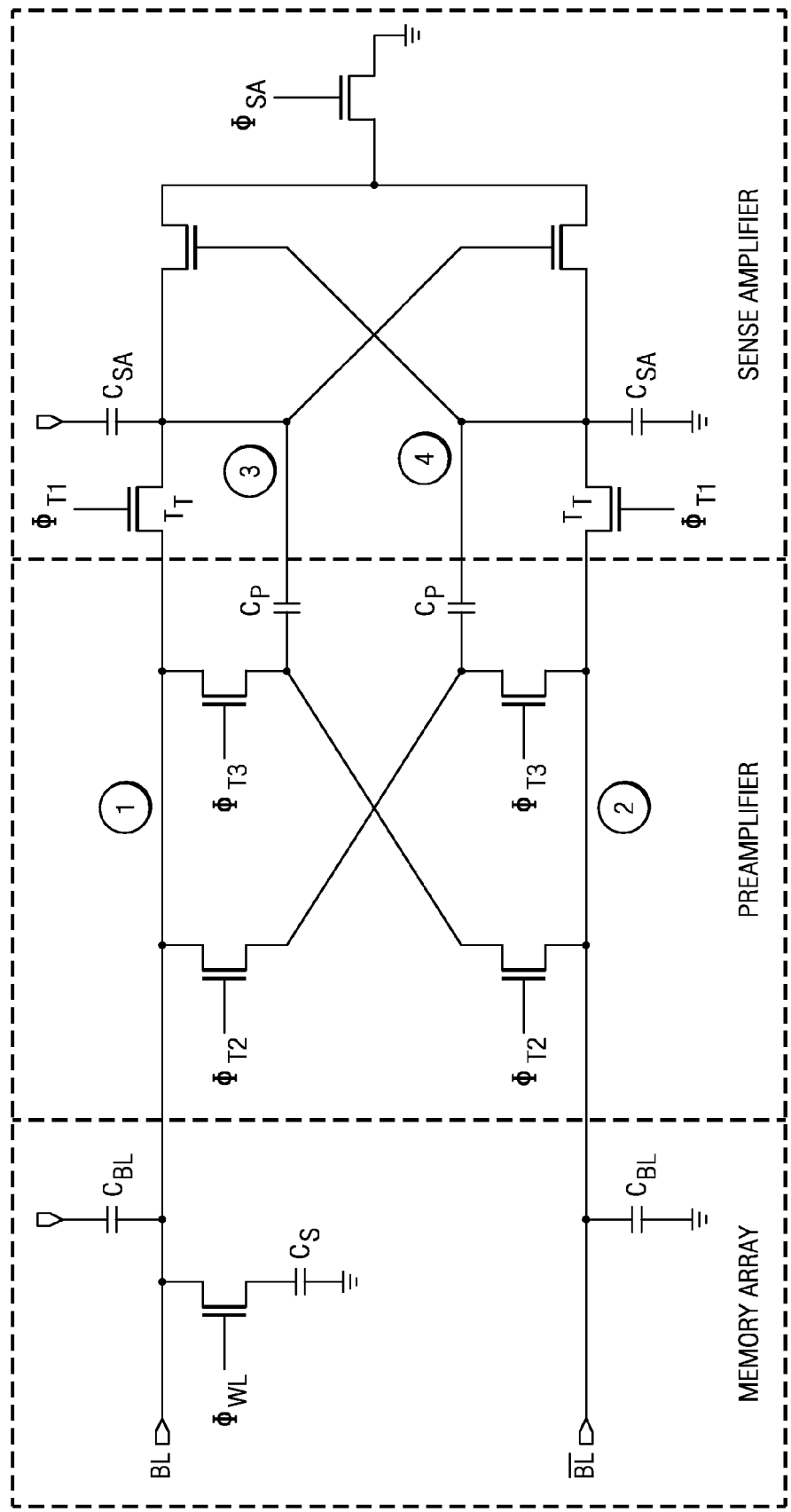
FIG. 5 is a circuit diagram of a prior art DRAM memory cell with associated preamplifier.
Figure 6:
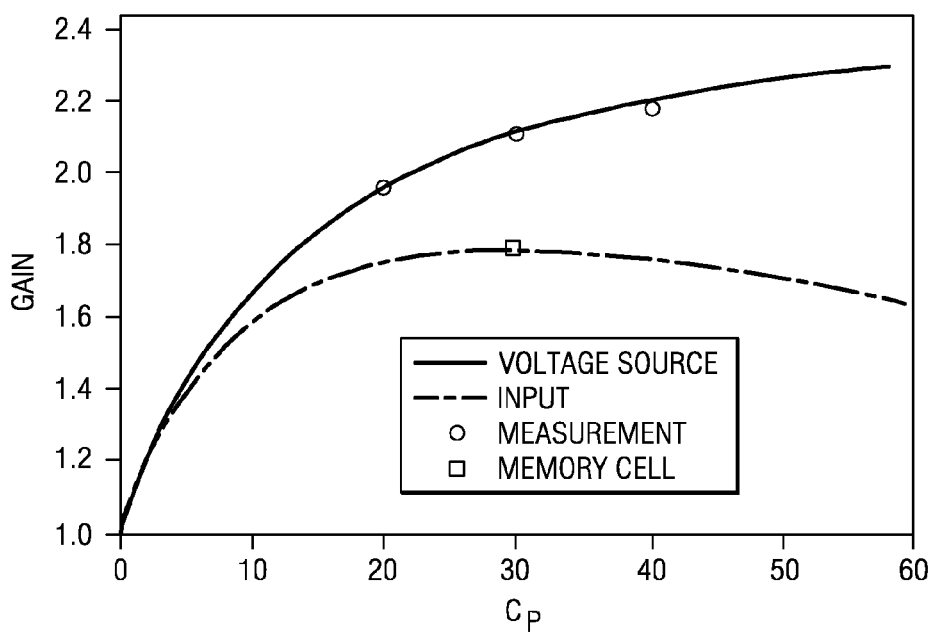
FIG. 6 is a graph showing the relationship of gain to coupling capacitance for the circuit of FIG. 5.

FIG. 3 is a schematic of a circuit according to a preferred embodiment of the present invention. Two bitlines are modeled in this schematic. The top bitline, bl1, has a memory cell comprising NMOS transistor MN0 and ferroelectric capacitor FEC0, that stores a ONE state. The bottom bitline, bl0, has a memory cell comprising NMOS transistor MN5 and ferroelectric capacitor FEC3, that stores a ZERO state. NMOS transistor MN1, ferroelectric capacitor FEC1, NMOS transistor MN4 and ferroelectric capacitor FEC2 constitute additional memory cells. A typical memory array will have many more such cells, of course.

The parasitic capacitance of the other cells that would be connected to these bitlines in an actual array is represented by capacitors C3 and C4. Capacitors C7 and C8 represent the input capacitance of a sense amplifier that would normally be connected to the bitlines. Capacitors C5 and C6, made from NMOS devices having their gate as one plate and their source and drain connected together as the other plate, correspond to capacitor C1 in FIG. 1. NMOS transistor devices MN14 and MN15 correspond to switch SW3 in FIG. 1, NMOS transistor devices MN12 and MN13 correspond to switch SW2 in FIG.

1, and complementary device pairs MP2 and MN16, and MP3 and MN17, correspond to switch SW1 in FIG. 1.

Figure 4:
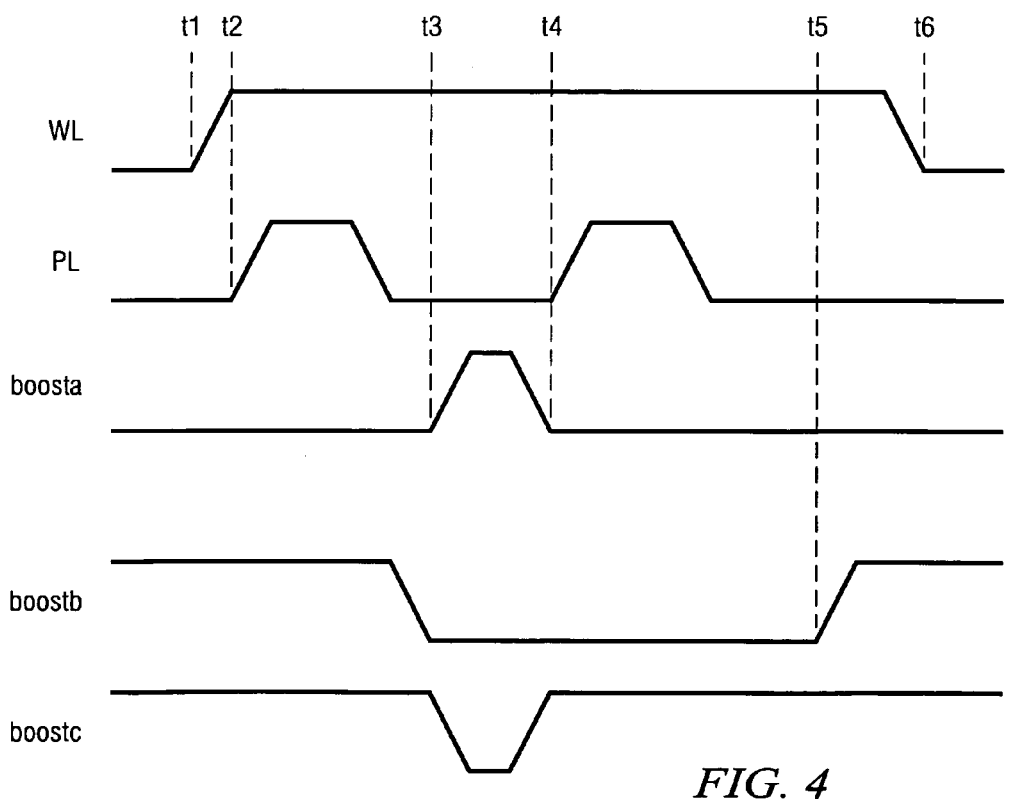
FIG. 4 is a signal timing diagram showing the relative timing of various signals generated in the operation of the circuit of FIG. 3.

Referring now to FIG. 4, which is a signal timing diagram showing the relative timing of various signals generated in the operation of the circuit of FIG. 3, circuit behavior up to time t3 is the same as in prior art FRAM circuits. After the address inputs have been decoded to determine the specific wordline that is being accessed, line WL transitions high. At approximately the same time, at time t2 in FIG. 4, the associated plateline PL transitions high. For FRAMs, there are two modes of operation for the plateline. The one shown in FIG. 4 is commonly referred to as "after pulse" or "up-down" sensing. The particular plateline mode of operation has no bearing on the efficacy of the invention. At time t3, all three signals, boosta, boostb and boostc, switch states to activate operation of the invention. In an exemplary embodiment of the circuit of FIG. 3, total bitline capacitances, C3 and C4, are assumed to be 340 fF. Using these values in Equation (5) predicts a voltage gain, $V2f/V2i$, of 1.84. From actual circuit simulation, the signal value prior to activation is 155 mV for the ONE state (Vbl1 and Vsal1). The ZERO signal level before activation is 24 mV (Vbl1 and Vsal0).

In the exemplary embodiment, after activation, at time t3, signals sal1 and sal0 stabilize in well under a nanosecond in time. After activation, at time t4, sal1 has been boosted to 283 mv and sal0 has increased to 43 mv. Voltage gain for the ONE state is 82% and 79% for the ZERO state. Differential voltage has been increased from 131 mv to 240 mv, or slightly under 83%. The simulated values are very close to the 84% increase predicted by Equation (5).

There are several benefits that make the present invention particularly attractive when applied to DRAMs. To illustrate these benefits, consider the parameters shown in Table 1 for a DRAM that might be produced on an exemplary leading edge technology.

TABLE 1

| Cc | Cbl | C1 | Csa | Vbl(1) | Dv(1) | V2i | V2f/V2i | Dv(boost) |
|----|-----|----|----|--------|-------|-----|---------|-----------|
| 25 | 150 | 35 | 10 | 0.784 | 0.034 | 0.778 | 1.74 | 0.053 |
| 15 | 150 | 35 | 10 | 0.771 | 0.021 | 0.768 | 1.74 | 0.034 |

In understanding Table 1, assume that a VDD/2 precharge level is used and that a precharged complement bitline acts as the reference input to the sense amp. Also assume a VDD of 1.5 v and a minimum ONE cell voltage of 1 volt. Cc is the cell capacitance, Cbl is the bitline capacitance, C1 is chosen by design to be 35 fF and Csa is the assumed sense amplifier input capacitance. Vbl(1) is the voltage that would be produced on the bitline from reading the ONE state if the inventive principles were not applied. Likewise, Dv(1) is the differential voltage that would be produced at the inputs to the sense amplifier if the inventive principles were not applied. $V2i$ is the bitline voltage after reading the ONE cell with the application of the inventive principles. The difference in Vbl (1) and $V2i$ results from the addition of the 35 fF to the bitline capacitance prior to activation, when applying the inventive principles. Dv(boost) is the differential voltage at the sense amp after activation, when applying the inventive principles.

In the first case, with a 25 fF cell capacitance, a 34 mv differential input voltage is produced if the inventive principles are not applied. With application of the inventive principles, the differential input voltage has been increased to 53 mV. In the second case, when the inventive principles are applied, only a 15 fF cell capacitance is needed to produce the original 34 mV differential input voltage of the first case. This represents a 40% reduction in cell capacitor size. This capacitance reduction allows significant cost reduction for a memory manufacturer, either in area reduction of the device or reduction in process difficulty to produce the vertical dimension required for 3D capacitor structures.

An additional benefit when applying the inventive principles to DRAMs can be understood by reference to the bitline voltage and the amplification factor listed in Table 1. For a VDD/2 precharge scheme, which is preferable from a power perspective, the input bitline voltage for a ONE is only 0.784 volts if the inventive principles are not applied. This voltage is in the same range as the threshold voltages of the sense amplifier transistors in a DRAM process. Thus, there is very little gate voltage drive, (Vgs-Vt), for the sense amplifier. The settling time of the sense amplifier becomes very long under such input conditions. This is one of the factors preventing lowering of the operating voltages for DRAMs today. Notice, however, that with the inventive principles applied, there is not only signal amplification, but the absolute voltage on the input has been increased to 1.74*0.778=1.354v, providing a much improved gate voltage drive with a faster settling time of the sense amplifier.

One issue in applying the inventive principles to DRAMs arises with the physical implementation of switch SW1. In most DRAMs there is an NMOS transistor superimposed between the bitline and the sense amplifier. This device allows multiplexing the sense amplifier between two different bitlines. During the precharge state of the memory array, the gate of this NMOS transistor is biased at VDD by a signal that is shared with a large number of such devices. This device is the obvious candidate for implementation of switch SW1, but complete discharge of the gates of all these devices when switch SW2 closes and switch SW3 opens causes an undesirable increase in operating power for the memory. However, with the bitline precharged to approximately VDD/2 and the gate of this device at, or approximately at, VDD, this device is resistive, and the on-resistance of the device provides sufficient isolation between the bitline node and sense amplifier input node that signal amplification is still achieved. Complete discharge of the gate of this device is not required to obtain the benefits of the inventive principles.

Although the present invention and its advantages have been described in detail, it should be understood that various changes, substitutions and alterations can be made herein without departing from the spirit and scope of the invention as defined by the appended claims. For example, the invention may be applied in a broad variety of other circuits where a preamplifier operation is desired in order to boost a voltage. A representative example of another use of this invention is in an input buffer designed for a limited-voltage-swing interface. By limiting the voltage level used to represent the logic input levels, signaling power consumed in the interface can be reduced. However, this reduced input voltage swing makes the input buffer design more difficult in distinguishing between the two logic states. The invention can be applied at the input of the buffer to increase the separation between the two logic states, without the increase in power associated with a commensurate increase in the interface signal levels themselves. Since most interfaces today are synchronous, requiring data to be latched on chip, the invention can be applied directly, without any increase in control signal complexity or loss in system performance. Other examples may be readily thought of, once the principles of the invention, as set forth herein, are understood.

What is claimed is:

1. A preamplifier, comprising:
   a first node;

a second node;

a first switch connected between the first node and the second node;

a second switch and a first capacitor connected in series between the first node and the second node, with a terminal of the second switch being connected to the first node, the common connection node of the second switch and the first capacitor comprising a third node; and a third switch connected between the third node and ground, the first and third switches being adapted to be closed and the second switch to be open, in a first operation phase, and the first and third switches being adapted to be open and the second switch to be closed, in a second operation phase during which a voltage on the second node may be boosted to an amplified value.

2. The preamplifier as in claim 1, wherein the first switch is resistive during the second operation phase.

3. The preamplifier as in claim 1, further comprising:
a second capacitor connected between the first node and ground; and
a third capacitor connected between the second node and ground, wherein the preamplifier functions as a memory cell.

4. The preamplifier as in claim 1, further comprising:
a second capacitor connected between the first node and ground; and
a third capacitor connected between the second node and ground,
wherein the preamplifier amplifies the voltage at the second node.

5. A memory cell connected to a bitline node for storing a memory state that gives rise to a cell voltage representing a bit value, the memory cell being capable of having the cell voltage boosted to a boost value during a read operation of the memory state, comprising:

a parasitic bitline capacitance between the bitline node and ground;

a first capacitor connected between a second node and ground;

a first switch connected between the bitline node and the second node;

a second switch and a third capacitor connected in series between the bitline node and the second node, with a terminal of the second switch being connected to the bitline node, the common connection node of the second switch and the third capacitor comprising a third node; and a third switch connected between the third node and ground, the first and third switches being adapted to be closed and the second switch to be open, in a first operation phase, and the first and third switches being adapted to be open and the second switch to be closed, in a second operation phase during which the cell voltage is boosted to the boost value.

6. The memory cell as in claim 5 wherein the second node comprises an input to a sense amplifier.

7. A memory cell array, comprising a plurality of memory cells, each such memory cell for storing a memory state that gives rise to a cell voltage representing a bit value for that memory cell, each memory cell being capable of having the cell voltage increased to a boosted value during a read operation of the memory state and comprising:

a first capacitor between a first node and ground;

a second capacitor connected between a second node and ground;

a first switch connected between the first node and the second node;

a second switch and a third capacitor connected in series between the first node and the second node, with a terminal of the second switch being connected to the first node, the common connection node of the second switch and the third capacitor comprising a third node; and a third switch connected between the third node and ground, the first and third switches being adapted to be closed and the second switch to be open, in a first operation phase, and the first and third switches being adapted to be open and the second switch to be closed, in a second operation phase during which the cell voltage is increased to the boosted value.

8. The memory cell array as in claim 7 wherein the second node comprises an input to a sense amplifier.

9. The memory cell array as in claim 7 wherein the first node comprises a bitline node.

10. The memory cell array as in claim 7 wherein the first switch is resistive during the second operation phase.

11. A method for increasing voltage at a node in a circuit comprising the steps of:

providing a first node, a second node and a first switch connected between the first node and the second node;

providing a second switch and a first capacitor connected in series between the first node and the second node, with a terminal of the second switch being connected to the first node, the common connection node of the second switch and the first capacitor comprising a third node;

providing a third switch connected between the third node and ground; and in a first operation phase:

closing the first and third switches and opening the second switch; and in a second operation phase:

opening the first and third switches and closing the second switch, whereby, during the second operation phase, a voltage on the second node may be boosted to an amplified value.

12. The method as in claim 11, further comprising the step of applying an initial voltage to the second node in the first operation phase, whereby the initial voltage is boosted to the amplified value in the second operation phase.

* * * * *